United States Patent [19]
Lemoussu et al.

[11] 4,349,785
[45] Sep. 14, 1982

[54] PHASE-CONTROLLING FEEDBACK CIRCUIT FOR SINGLE SIDEBAND DEMODULATION

[75] Inventors: Michel Lemoussu, Saint Michel sur Orge; Claude Cardot, Gif sur Yvette, both of France

[73] Assignee: Compagnie Industrielle des Telecommunications Cit-Alcatel, Paris, France

[21] Appl. No.: 187,643

[22] Filed: Sep. 16, 1980

[30] Foreign Application Priority Data

Sep. 19, 1979 [FR] France ............................. 79 23306

[51] Int. Cl.$^3$ .......................... H03D 1/00; H03L 7/08
[52] U.S. Cl. ........................................ 329/50; 331/12; 331/17; 331/23; 331/25; 455/202; 455/260
[58] Field of Search ..................... 331/10–12, 331/17, 23, 25; 329/50, 122, 124; 455/202, 203, 204, 260; 375/120

[56] References Cited

U.S. PATENT DOCUMENTS 3,669,511 6/1972 Motley et al. ................. 455/202 X
3,675,131 7/1972 Pickholtz ......................... 329/50 X
4,091,410 5/1978 Citta .................................. 329/50 X
4,253,189 2/1981 Lemoussu et al. ................. 375/116

FOREIGN PATENT DOCUMENTS 2444429 2/1976 Fed. Rep. of Germany.
2305074 10/1976 France.

Primary Examiner—Siegfried H. Grimm
Attorney, Agent, or Firm—Sughrue, Mion, Zinn, Macpeak & Seas

[57] ABSTRACT

A feedback circuit for controlling the phase of a local oscillator provided with frequency adjusting means and delivering a local carrier wave for demodulating a data signal transmitted by single side band amplitude modulation, the said feedback circuit comprising at least one sign multiplier (21) producing the product of the sign of the local demodulation carrier shifted by a phase difference of $\pi/4$ multiplied by the sign of the data signal to be demodulated, followed by a sign coincidence autocorrelator (22) which controls the said frequency adjusting means and correlates two versions of the signal delivered by the sign multiplier (21), one of the two versions being delayed relative to the other by an odd multiple of one fourth of the period of the carrier used for the amplitude modulation on transmission.

6 Claims, 3 Drawing Figures

PHASE-CONTROLLING FEEDBACK CIRCUIT FOR SINGLE SIDEBAND DEMODULATION

The present invention relates to data transmission and more particularly to the recovery of the carrier from a data signal transmitted by single side band amplitude modulation, said carrier not necessarily being present in the signal.

BACKGROUND OF THE INVENTION

In the first data transmission systems using amplitude modulation, the carrier was recovered at the receiver from a vestigial carrier left in the transmitted signal for this purpose, or from specific pilot frequency signals added to the transmitted signal. However, this wastes the frequency spectrum available and reduces transmission efficiency. Subsequently it was proposed that the carrier should be recovered from particular characteristics of the received and demodulated data signal, without using pilot frequencies or vestigial carriers. Thus, for synchronous digital transmission using single sideband amplitude modulation, it is known to use carrier recovery circuits that use an oscillator controlled by a feedback control circuit tending to cancel the average value of the received and demodulated signals between two consecutive transitions in the same direction, or tending to maximise a component at twice the symbol frequency of the synchronous digital signal, said component being obtained by squaring the received and demodulated signal, or even, tending to make the spacing between odd and even zero passages of the received and demodulated signal equidistant on average. Carrier recovery circuits of the latter type are described in the Assignee's published French patent application No. 7806954 filed on the Mar. 10, 1978 and published under the No. 241 96 14 (corresponding to U.S. Pat. No. 4,253,189). Essentially, these circuits comprise a voltage controlled variable frequency oscillator (VCO) where the control voltage is provided by a sign coincidence auto-correlator operating on the basis of two versions of the received and demodulated signal, one version being delayed relative to the other by an integer multiple of a unit time interval in the synchronous digital signal under consideration. These circuits have the advantage of being constituted principally from circuit elements that operate on an all or nothing basis and which are therefore cheap to embody using the technologies usually used for embodying digital circuits.

SUMMARY OF THE INVENTION

Preferred embodiments of the present invention provide a carrier recovery circuit of the above type, which does not require the presence of a residual carrier in the transmitted signal, nor the presence of special pilot frequencies, said circuit being capable of simple realisation using, for the most part, circuit elements that operate on an all or nothing basis.

The present invention provides a feedback circuit for controlling the phase of a local oscillator, the local oscillator providing an output local carrier wave for demodulating a data signal transmitted by single sideband amplitude modulation, and having a control input for varying the phase of the output local carrier wave, the feedback circuit comprising:

a first input for receiving a first signal representative of the sign of the local carrier wave shifted by a phase difference of $\pi/4$;

a second input for a second signal representative of the sign of the data signal to be demodulated by the local carrier wave;

a sign multiplier connected to receive said first and second signals and to produce a product signal representative of the first sign signal multiplied by the second sign signal; and a sign coincidence auto-correlator including a delay circuit connected to delay the product signal by an odd multiple of one fourth of the period of the carrier used for the amplitude modulation on transmission, thereby making two versions of the product signal available, one version being delayed relative to the other by said odd multiple period, and means for providing an output signal representative of the correlation of said two versions, said output signal being applied to said control input of the local oscillator.

BRIEF DESCRIPTION OF THE DRAWINGS

Two embodiments of the invention are described by way of example, with reference to the accompanying drawings in which.

DETAILED DESCRIPTION

The following description is limited to a data transmission system using single sideband amplitude modulation in which the lower sideband is retained, however it is obvious that the invention applies equally to the case where the upper sideband is retained.

Figure 1:
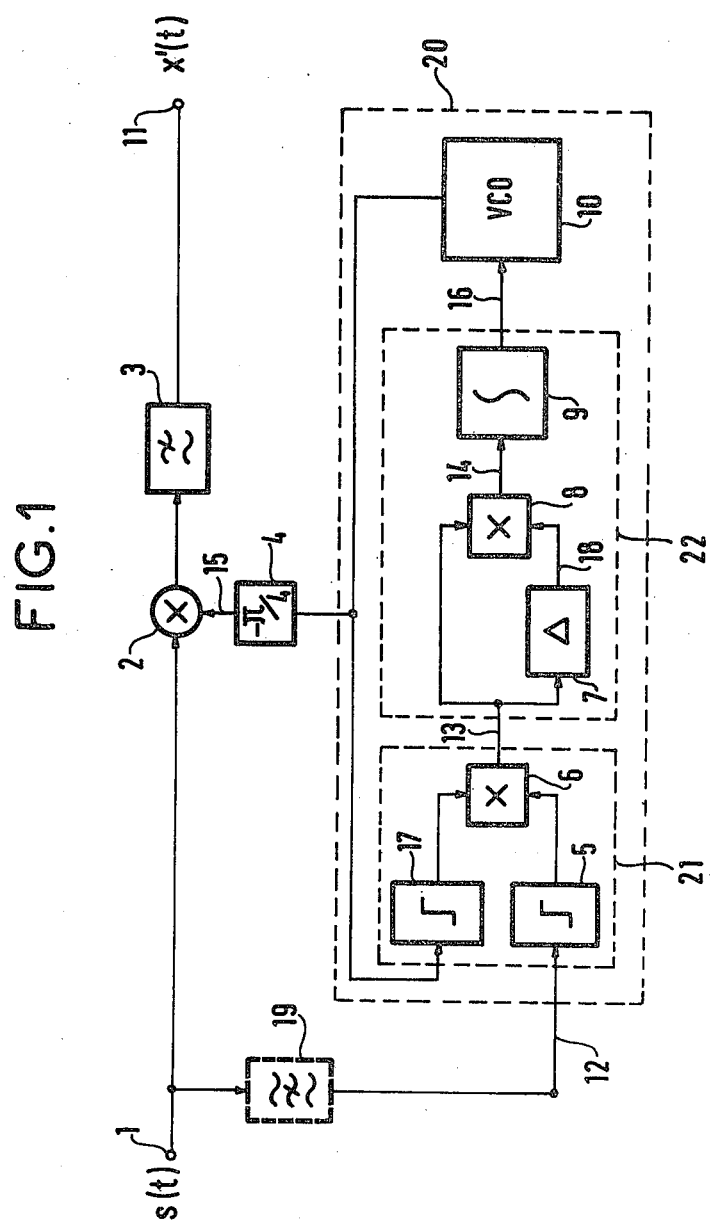
FIG. 1 is a block diagram of a demodulator implementing a local oscillator provided with a phase-controlling feedback circuit in accordance with the invention.
Figure 3:
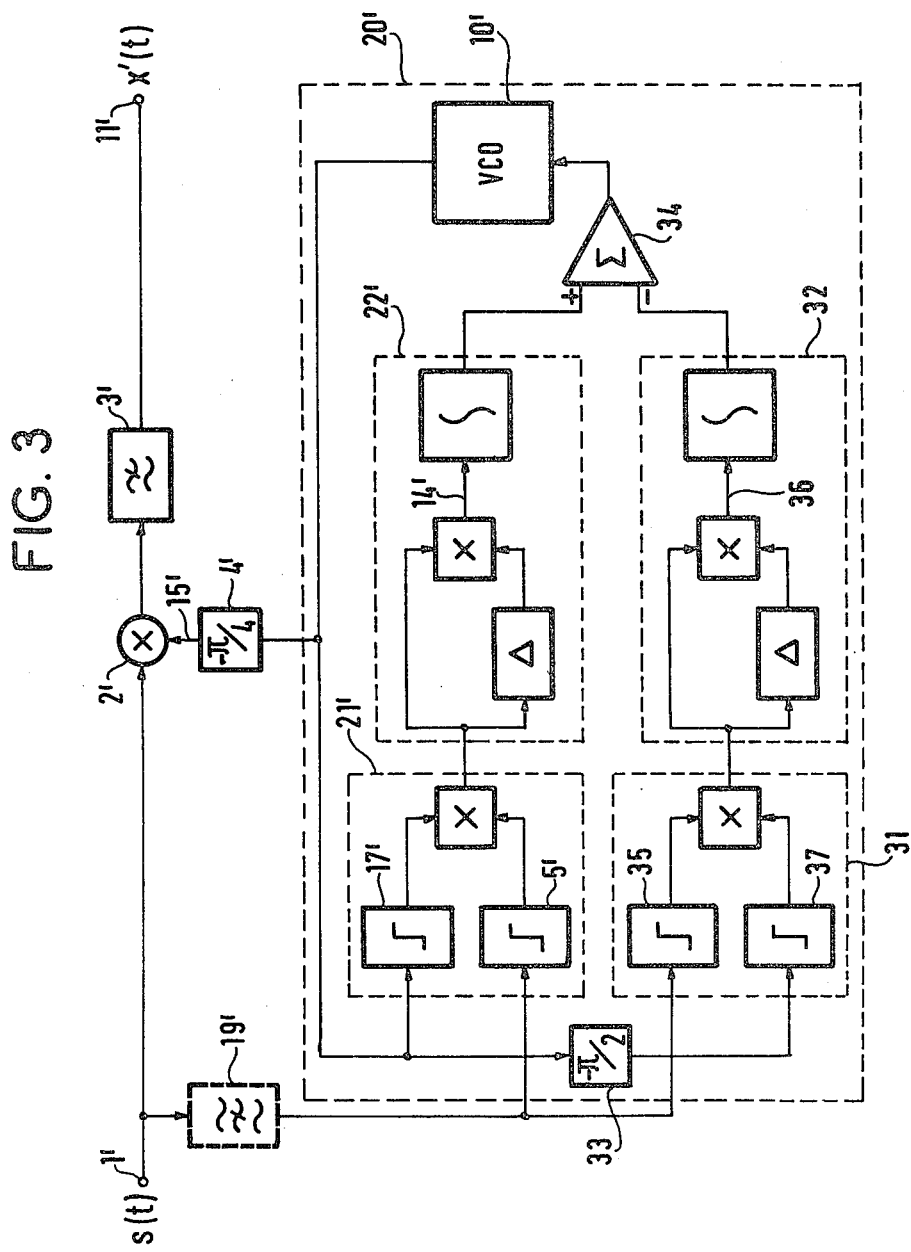
FIG. 3 is a block diagram of a variant of the demodulator shown in FIG. 1.

Each of the demodulators shown in FIGS. 1 and 3 comprises a linear modulator 2,2' and a low-pass filter 3,3' connected in series between an input 1, 1' and an output 11,11', together with a carrier recovery circuit 20, 20' having a voltage controlled variable frequency oscillator 10, 10' provided with a phase-controlling feedback circuit in accordance with the invention.

The signal s(t) which is applied to the inputs 1,1' of the demodulators is derived by single sideband amplitude modulation using the lower sideband and has the form:

$$s(t) = x(t)\cos\omega t + \hat{x}(t)\sin\omega t \qquad (1)$$

where x(t) is the modulating signal, $\hat{x}(t)$ is the Hilbert transform of the signal x(t) and $\omega$ is the angular frequency used for conveying the modulation. A derivation of this expression can be found, for example, in pages 170 to 174 of the book "Principles of Data Communication" by Lucky, Salz and Weldon and published by McGraw-Hill in 1968.

The modulating signal x(t) results from coded and shaped synchronous binary data $a_i$. It may be expressed as:

$$x(t) = \sum_{i=-\infty}^{+\infty} a_i g(t - iT)$$

where g(t) is the shape of single pulses transmitted at T-sec intervals (i.e. T is the Baud period). Further details may be found in chapter 4 of the above-mentioned book.

Assume that the local carrier applied to the input 15 of the linear modulator 2 and supplied by the carrier recovery circuit 20, 20' has the same frequency as the transmitter carrier used for the modulation, but at a phase delayed by an angle $\theta$ with respect to the carrier phase that would provide the best demodulation. This results in a signal x'(t) appearing at the output 11,11' of the low-pass filter 3,3' (which passes only the lower beats generated by the modulator 2, 2'), said signal x'(t) having the form:

$$x'(t) = x(t) \cos \omega + \hat{x}(t) \sin \theta$$

where x'(t) is equal or opposite to the modulating signal x(t) only when the angle $\theta$ is zero to within $k\pi$. That is why it is necessary to adjust the phase of the receiver carrier used for demodulation, which function is performed by the carrier recovery circuits 20, 20' of the demodulators shown in FIGS. 1 and 3.

The carrier recovery circuit 20 of the demodulator shown in FIG. 1 comprises an oscillator 10 which is provided with a phase-controlling feedback circuit. The oscillator 10 generates a wave whose frequency is equal to that of the local carrier and which is $\pi/4$ in advance thereof. The oscillator 10 is a voltage control oscillator (VCO) whose frequency is controlled by a voltage applied to a control terminal 16. The output of the oscillator is connected to the input 15 of the linear modulator 2 via a constant phase shifter 4 which eliminates the phase advance. The phase controlling feedback circuit comprises a sign multiplier 21 which multiplies the sign of the signal at the output of the oscillator 10 by the sign of the data signal s(t) received at the input 1 of the demodulator, followed by a sign coincidence auto-correlator 22 connected to the control terminal of the oscillator 10 and determining the correlation between two versions of the signal at the output sign multiplier 21. One of the versions is delayed with respect to the other by a period $\Delta$ equal to an odd multiple of one fourth of the period of the carrier used at the transmitter for modulation:

$$\Delta = (2k + 1)\frac{\pi}{2\omega}$$

where k is an integer.

The sign multiplier 21 is constituted by: a first hard limiter 5 whose input is connected to the demodulator input and which delivers a binary signal sgn[s(t)] which is equal to +1 if s(t) is positive and to −1 otherwise: a second hard limiter 17 whose input is connected to the output of the oscillator 10 and which operates in the same way on the oscillator signals; and a first binary multiplier 6 having two inputs, one of which is connected to the output of the first hard limiter 5 and the other of which is connected to the output of the second hard limiter 17, and whose output provides a signal representative of the product equal to ±1 of the two quantities which it receives, said product constituting the output signal from the sign multiplier 21.

The sign coincidence auto-correlator 22 comprises: a delay circuit 7 which introduces a delay equal to $\Delta$ and which has its input connected to the output of the first binary multiplier 6; a second binary multiplier 8 having two inputs connected to the output of the first binary multiplier 6, one being connected directly and the other via the delay circuit 7; and an integrator 9 connected to the output of the second binary multiplier 8. The second binary multiplier delivers a binary output signal of value ±1 in response to the binary signals of value ±1 which it receives on its inputs; the output signal is applied to the integrator 9 which averages it over a long period of time compared with T to provide the control voltage for the oscillator 10.

The carrier recovery circuit 20 may be modified in various ways without affecting its operation:

where the oscillator 10 delivers a rectangular signal at the carrier frequency and not the sinusoidal signal, the second hard limiter 17 is pointless and may be omitted. In this case the phase shifter 4 should be replaced by a delay circuit providing a delay of $\pi/4\omega$;

it has been assumed that the signals processed by the units 6,7, and 8 have possible values of +1 and −1. However, they could also have possible values of +1 and 0. In this case the binary multipliers 6 and 8 need to be modulo-2 adders and the hard limiters 5 and 17 should be a arranged to deliver signals of value +1 and 0 as a function of the sign of their input signals. Since the modulo-2 addition table and the multiplication table for the numbers +1 and −1 are isomorphic, the control signals appearing at the output 16 of the phase-controlling feedback circuit for one arrangement is a linear function of the control signal that would appear for the other;

the operation of the phase-controlling feedback circuit does not rely on there being a residual carrier in the transmitted signal. Indeed, if such a residual signal is transmitted, it is likely to perturb operation, and it is possible, where applicable, to eliminate such a residual carrier by means of a notch filter 19 inserted between the input 1 of the demodulator and the input to the hard limiter 5. The notch filter 19 then eliminates frequencies adjacent to the carrier frequency from the received signal.

The feedback circuit for controlling the phase of the demodulator as described above, requires the following two conditions to be satisfied for operation:

(1) the stream of binary symbols $a_i$ that convey the data to be transmitted must be random (in practice this is always the case because of scramblers used in data transmission); and (2) the pulse shape g(t) must have a time average value of zero:

$$\int_{-\infty}^{+\infty} g(t) \cdot dt = 0$$

(this condition is always met for cable transmission since when the time average g(t) is not zero, the cable receives an increasing electric charge over time). In particular, this condition applies when class 4 type partial response coding and pulse-shaping are used.

An essential feature of the phase controlling feedback circuit is that it only operates for part of the time (active periods) and that it does not change the frequency of the controlled oscillator 10 during the rest of the time (neutral periods).

In the non-limiting example where a class 4 partial response pulse shape is used, the active periods amount to $\frac{1}{8}$ of the total operating time of the apparatus.

Computer simulation and experience have shown that an active period of about this size is sufficient to ensure stable and effective phase locking of the local oscillator.

Looking at FIG. 1, it will be seen that the output signal from the hard limiter 5 is given by $sgn[s(t)]$.

This signal depends only on the instantaneous frequency of the analytic signal associated with $x(t)$.

Let the signal delivered by the local oscillator be $\cos(\omega t + \phi)$, where $\phi$ is the instantaneous phase error of the oscillator, in which case the signal delivered by the hard limiter 17 is:

$$sgn[\cos(\omega t + \phi)]$$

and the signal applied to the point 13 by the first binary multiplier is:

$$S_{13} = sgn[s(t)] \cdot \cos(\omega t + \phi)$$

If the instantaneous angular frequency of the analytic signal associated with $x(t)$ is different from $\omega$ at a given instant, the signal appearing at 13 will have a zero time average.

For example if $s(t) = \cos(\omega' t + \phi')$, where $\omega' \neq \omega$ then:

$$S_{13} = sgn[s(t) \cdot \cos(\omega t + \phi)]$$
$$= sgn[\cos(\omega t + \phi) \cdot \cos(\omega' t + \phi')]$$
$$= sgn[\cos((\omega + \omega')t + (\phi + \phi')) + \cos((\omega - \omega')t + (\phi - \phi'))]$$

Since the expression between braces is the sum of two sinusoidal functions of different frequencies, the functions are independent in the Steinhaus sense and the expression between braces is positive as often as it is negative, such that the average of the sign tends to zero over a sufficient time interval. So long as this condition is true, the feedback is in a neutral period. Fluctuations with an average value of zero in the signals $S_{13}$ delivered by the first multiplier 6 and $S_{14}$ delivered by the second multiplier 8 are eliminated by the integrator 9 and the frequency of the oscillator 10 remains constant.

In contrast, if the angular frequency of the analytic signal associated with $x(t)$ is equal to $\omega$, the signal appearing at 13 has a non-zero time average: putting $s(t) = A \cdot \sin \omega t$, we have:

$$S_{13} = sgn[s(t) \cdot \cos(\omega t + \phi)]$$
$$= sgn[A \cdot \sin \omega t \cdot \cos(\omega t + \phi)]$$
$$= sgn[A] \cdot sgn[\sin(2\omega t + \phi) - \sin\phi]$$

which expression has a time average that tends towards:

$$av(S_{13}) = sgn[A] \cdot \frac{-2\phi}{\pi}$$

over a sufficient period of integration.

Figure 2:
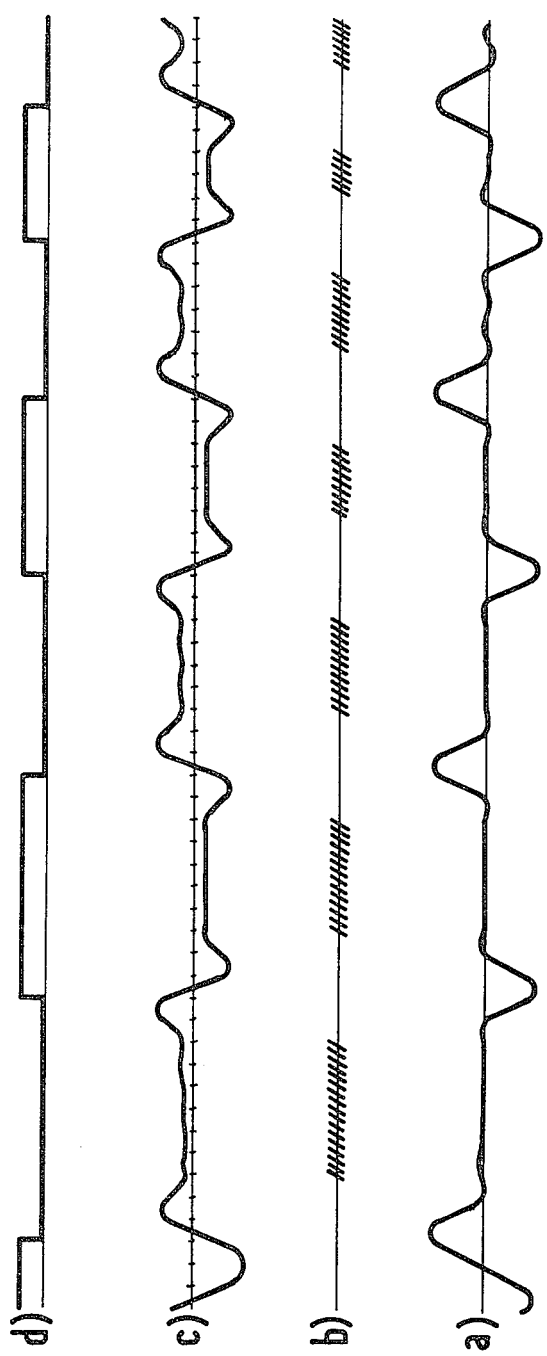
FIG. 2 is a waveform diagram for facilitating understanding of the demodulator of FIG. 1.

The feedback is then in an active period. For such an active period to exist, equation (1) shows that this requires there to be a stretch of time for which the signal $x(t)$ (after coding and shaping) is negligible compared to its Hilbert transform $\hat{x}(t)$ and for which the Hilbert transform does not cancel itself. Such stretches of time are usual in data transmission in using a pulse shape $g(t)$ whose average value is zero. The waveforms of FIG. 2 illustrate this property for data transmission using class 4 partial response type coding and shaping. Waveform d shows a stream of transmitted symbols $a_i$ comprising consecutive groups of more than four symbols each equal to 0 or to 1 (this stream is not random but has been chosen for the purposes of demonstration). Waveform a shows the corresponding signal $x(t)$ obtained after coding and shaping). Waveform c shows the Hilbert transform signal $\hat{x}(t)$ of the signal $x(t)$.

From FIG. 2, it can be seen that for each sequence of $k$ consecutive symbols of the same type where $k$ is greater than or equal to 4, there exists a period of duration $(k-3)T$ during which $x(t)$ is negligible while its Hilbert transform $\hat{x}(t)$ does not change sign. These periods, shown by hatching in waveform b, are the periods of phase feedback activity. During these periods the instantaneous frequency of the analytic signal corresponding to $x(t)$ is close to zero.

In a genuinely random stream of $a_i$, the periods of feedback activity occupy $\frac{1}{8}$ of the time.

Indeed, an element taken at random from a random frequence has a probability:

$$\frac{k}{2^{k+1}}$$

of belonging to the sequence of $k$ identical symbols.

$$\left( \text{And clearly } \sum_{1}^{\infty} \frac{k}{2^{k+1}} = 1 \right)$$

Given that a sequence of $k$ identical symbols produces a period of activity of duration $(k-3)T$ it follows that the proportion of time during which feedback is active is given by:

$$\sum_{k=4}^{\infty} \frac{k-3}{k} \times \frac{k}{2^{k+1}} = \sum_{k=4}^{\infty} \frac{k-3}{2^{k+1}} = \frac{1}{8}$$

It can also be deduced from FIG. 2 and confirmed by calculation that no period of significant duration exists during which $\hat{x}(t)$ remains negligible. This results from the shape of the Hilbert transform of a pulse whose average is zero.

It may seem surprising that there exist significant periods during which the signal applied to the first binary multiplier 6 remains at an instantaneous angular frequency that differs little from $\omega$ even though this frequency does not exist in the spectrum of the incident signal $s(t)$, and that the (optional) notch filter 19 has the very function of eliminating such a frequency should it exist.

This is explained by the fact that, during the active periods, the signal at the point 1 or at the point 12 has the form: $A(t) \cdot \sin(\omega t)$, where $A(t)$ is a quantity that varies (without changing sign) and which represents the instantaneous amplitude of the analytic signal during these periods. The spectrum of the product $A(t) \cdot \sin(\omega t)$ does not include the frequency $\omega$; however, the passages through zero of the signal appearing at the output of the non-linear device 5 are separated by $\pi/\omega$ since the angular frequency of the signal is $\omega$ during the active periods.

To explain the function of the sign coincidence autocorrelator 22 during the periods of phase control feedback activity, it suffices to calculate the expression for its output signal $S_{16}$.

The sign coincidence auto-correlator 22 receives a signal $S_{13}$ from the sign multiplier 21 having the form:

$$S_{13} = sgn[A \cdot \sin(\omega t) \cdot \cos(\omega t + \phi)]$$

The delay circuit 17 has a time constant:

$$\Delta = \pi/2\omega$$

and therefore delivers a signal $S_{18}$ of the form:

$$S_{18} = sgn[A \cdot \sin(\omega t - \pi/2) \cdot \cos(\omega t + \phi - \pi/2)]$$
$$= sgn[-A \cdot \cos(\omega t) \cdot \sin(\omega t + \phi)]$$

The signal $S_{14}$ appearing in the output of a second binary multiplier 8 is the product of the signals $S_{13}$ and $S_{18}$. It has the form:

$$S_{14} = sgn[-A^2 \sin(2\omega t) \cdot \sin 2(\omega t + \phi)]$$
$$= sgn[\cos(4\omega t + 2\phi) - \cos(2\phi)]$$

The integrator 9 deduces the average value:

$$av(S_{14}) = \frac{4\phi - \pi}{\pi}$$

This equation shows:
that the output signal from the integration 9 depends only on $\phi$, which is the desired result; and
that the average value of the signal will be zero provided $\phi = \pi/4$.

The result of this is that the phase-controlling feedback loop shown in FIG. 1 will stabilise the carrier to a phase value such that $\phi = \pi/4$. Thus, to ensure that the signal applied to the linear modulator 2 produces proper demodulation, it is necessary to insert a fixed phase shifter 4 between the output of the local oscillator 10 and the input 15 of the linear modulator 2. The phase shifter should shift the frequency of the carrier by a fixed amount whose theoretical value is $-\pi/4$. Naturally, given the imperfections of a real system, the value of the phase shift will require some experimental adjustment in order to obtain a maximum aperture in the eye diagram.

The operation of the circuit in accordance with the invention remains the same and satisfies the same equations if the delay introduced by the delay line 7 is any odd multiple of $t = \pi/2\omega$.

In the diagram of FIG. 1, fixed gain amplifiers which may be necessary at various points to ensure proper operation of the units shown have been omitted. The design of such amplifiers is current practice for the person in the art.

FIG. 3 shows a variant of the demodulator described with reference to FIG. 1. In this variant the carrier recovery circuit is provided with a double phase-controlling feedback circuit using two quadrature versions of the local carrier. Items in this Figure which are unchanged with respect to the corresponding items of FIG. 1 have been given the same references with the addition of a prime.

As in the previous case, this demodulator has a linear modulator 2' connected in series with a low-pass filter 3' between an input 1' and an output 11', together with a carrier recovery circuit 20' having a voltage controlled variable frequency oscillator (VCO) 10' connected to one input 15' of the linear modulator 2' via a fixed phase shifter 4' and provided with a phase-controlling feedback circuit. The phase-controlling feedback circuit is doubled up in comparison with the previous one. It comprises:

a first sign multiplier 21' for producing the product of the sign of the signal at the output of the oscillator 10' multiplied by the sign of the data signal s(t) received at the input 1' of the demodulator;

a second sign multiplier 31 producing the product of the sign of the signal at the output of the oscillator 10' after being subjected to a phase delay of $\pi/2$ by a phase shifter 33 multiplied by the sign of the data signal s(t) received at the input 1' of the demodulator;

a first sign coincidence auto-correlator 22' for correlating two versions of the output signal from the first sign multiplier 21', one of said versions being delayed relative to the other by period $\Delta$ equal to an odd multiple of one fourth of the modulation carrier used for the transmission, i.e.

$$\Delta = (2k + 1)\frac{\pi}{2\omega}$$

where k is an integer;

a second sign coincidence auto-correlator 32 determining the correlation between two versions of the signal at the output of the second sign multiplier 31, one version being delayed relative to the other by a period $\Delta$; and a differential amplifier 34 having a non-inverting input connected to the output of the first sign coincidence auto-correlator 22' and an inverting input connected to the output of the second sign coincidence correlator 32 and an output connected to the control input of the oscillator 10'.

Each sign multiplier is constituted by a two-input binary multiplier having a hard limiter connected to each input.

Each sign coincidence auto-correlator is constituted by a two-input binary multiplier having a delay circuit of period $\Delta$ connected in series with one of its inputs and an integrator at its output with a time constant that is large relative to the unit time interval T.

A practical embodiment of the carrier recovery circuit 20' does not comprise all the components shown in FIG. 3 since some of them have been shown doubled-up merely to emphasize the relationship with the carrier recovery circuit of the modulator described above with reference to FIG. 1. This is particularly true of the hard limiters 5' and 35. It is also true of the hard limiters 17' and 37 which, in fact, are constituted by a single unit placed before the circuit 33 which is a delay circuit introducing a delay of $\pi/2\omega$.

The units 2', 3', 4' and 19' have the same functions as the corresponding unit 2,3,4, and 19 in the demodulator of FIG. 1. Their operation will not be described a second time.

The operation of the first sign multiplier 21' and that of the first sign coincidence auto-correlator 22' is the same as for the sign multiplier 21 and the sign coincidence auto-correlator 22 of the demodulator of FIG. 1 so that, using the same assumptions as those used for explaining the operation of the demodulator of FIG. 1, the signal $S_{14'}$ at the output of the multiplier of the first sign coincidence auto-correlator 22' has the form:

$$S_{14'} = S_{14} = sgn[\cos(4\omega t + 2\phi) = \cos(2\phi)]$$

during the periods of phase controlling feedback activity.

The second sign multiplier 31 and the second sign coincidence auto-correlator 32 operate similarly. Given that they are receiving the oscillator signal with a phase delay of $\pi/2$, the signal $S_{36}$ at the output of the multiplier of the second sign coincidence auto-correlator 32 has the formula:

$$S_{36} = sgn[\cos(2\phi) - \cos(4\omega t + 2\phi)] = -S_{14'} = -S_{14}$$

during periods of phase-controlling feedback activity.

The sign coincidence auto-correlators 22' and 32 thus deliver two correction signals that are equal and of opposite sign. Taking their difference in the differential amplifier 34, thus makes it possible to double the sensitivity of the phase-controlling feedback circuit.

The structure of the phase-controlling feedback circuit 20' compared with that of the phase-controlling feedback circuit 20 of the demodulator in FIG. 1 also has the advantage of considerably reducing the influence of drift that can appear in chains of DC amplifiers, particularly in integrators, due to that fact that the drifts of the two chains act in opposite directions on the final correction signal.

Without going beyond the scope of the invention, it is possible to replace various means by equivalent means, by way of example, the sign multipliers 21 of FIG. 1 and 21' and 31 of FIG. 3 could each be implemented by means of an analog multiplier followed by a hard limiter, the analog multiplier receiving the signal s(t) on a first input and the carrier wave from the variable frequency oscillator 10 or 10' together with the phase shift (where applicable) of the phase shifter 33 on a second input.

We claim:

1. A feedback circuit for controlling the phase of a local oscillator, the local oscillator providing an output local carrier wave for demodulating a data signal transmitted by single sideband amplitude modulation and having a control input for varying the phase of the output local carrier wave, the feedback circuit comprising:
    a first input for receiving a first signal representative of the sign of the local carrier wave shifted by a phase of $\pi/4$;
    a second input for a second signal representative of the sign of the data signal to be demodulated by the local carrier wave;
    a sign multiplier connected to receive said first and second signals and to produce a product signal representative of the first signal multiplied by the second signal; and
    sign coincidence auto-correlator means including a delay circuit connected to delay the product signal by an odd multiple of one fourth of the period of the carrier used for the amplitude modulation on transmission, to thereby provide two versions of the product signal, one version being delayed relative to the other by said odd multiple period, and means for providing an output signal representative of the correlation of said two versions, said output signal being applied to said control input of the local oscillator.

2. A feedback control circuit according to claim 1, wherein the local oscillator comprises a voltage controlled variable frequency oscillator followed by a fixed value phase shifter providing a phase delay of $\pi/4$, and wherein the sign multiplier of the feedback control circuit has a first input connected to the output of the voltage controlled variable frequency oscillator upstream of the fixed value phase shifter and a second input connected to receive the data signal to be demodulated.

3. A feedback control circuit according to claim 1, wherein the sign multiplier receives the signal to be demodulated via a notch filter for removing any residue of the carrier used for amplitude modulation on transmission which may remain.

4. A feedback control circuit according to claim 1, wherein the sign multiplier comprises:
    a first hard limiter receiving at its input the data signal to be demodulated and delivering at its output a binary signal corresponding to the sign of the data signal to be demodulated;
    a second hard limiter receiving at its input the local carrier shifted by a phase difference of $\pi/4$ and delivering at its output a binary signal corresponding to the sign of the local carrier shifted by a phase of $\pi/4$; and
    a first binary multiplier having two inputs, one connected to the output of the first hard limiter and the other to the output of the second hard limiter.

5. A feedback control circuit according to claim 1, wherein said delay circuit has an input connected to the output of the sign multiplier to thereby introduce a delay equal to an odd multiple of one fourth of the period of the carrier used for the amplitude modulation on transmission; and the sign coincidence auto-correlator means further comprises a second binary multiplier having two inputs connected to the output of the sign multiplier, one directly and the other via the delay circuit, and an integrator connected to the output of the second binary multiplier.

6. A feedback circuit for controlling the phase of a local oscillator, the local oscillator providing an output local carrier wave for demodulating a data signal transmitted by single sideband amplitude modulation and having a control input for varying the phase of the output local carrier wave, the feedback circuit comprising:
    a first sign multiplier producing the product of (i) the sign of the local carrier advanced by a phase substantially equal to $\pi/4$ and (ii) the sign of the data signal to be demodulated;
    a second sign multiplier producing the product of (i) the sign of the local carrier retarded by a phase substantially equal to $\pi/4$, and (ii) the sign of the data signal to be demodulated;
    first sign coincidence auto-correlator means correlating two versions of the signal delivered by the first sign multiplier, one of the said versions being delayed relative to the other by an odd multiple of one fourth of the period of the carrier used for the amplitude modulation on transmission;
    second sign coincidence auto-correlator means correlating two versions of a signal delivered by the second sign multiplier, one of the said versions being delayed relative to the other by an odd multiple of one fourth of the period of the carrier used for the amplitude modulation on transmission; and
    a differential amplifier having a first input connected to the output of the first sign coincidence auto-correlator means and a second input connected to the output of the second sign coincidence auto-correlator means and delivering the output signal of the feedback circuit.

* * * * *